United States Patent [19]

Schaefer

[11] Patent Number: 5,446,393
[45] Date of Patent: Aug. 29, 1995

[54] ELECTRICAL MEASURING AND TESTING PROBE HAVING A MALLEABLE SHAFT FACILITATING POSITIONING OF A CONTACT PIN

[76] Inventor: Richard K. Schaefer, 20 Princeton Cir., Longmont, Colo. 80503

[21] Appl. No.: 65,965

[22] Filed: May 21, 1993

[51] Int. Cl.⁶ .................................................. G01R 1/04
[52] U.S. Cl. ..................................... 324/754; 324/72.5
[58] Field of Search ............... 324/158 F, 158 P, 72.5, 324/149, 750, 754, 755; 439/482

[56] References Cited

U.S. PATENT DOCUMENTS

| | | | |
|---|---|---|---|
| 1,650,779 | 11/1927 | Williams | 324/72.5 |
| 1,910,827 | 5/1933 | Fedotoff | 324/72.5 |
| 3,458,687 | 7/1969 | Cranch | 324/158 P |
| 3,551,807 | 12/1970 | Kulischenko et al. | 324/158 P |
| 3,944,922 | 3/1976 | Chambers et al. | 324/158 P |
| 4,123,706 | 10/1978 | Roch | 324/158 P |
| 4,151,465 | 4/1979 | Lenz | 324/72.5 |
| 4,403,822 | 9/1983 | Smith | 324/158 P |
| 4,806,856 | 2/1989 | Hvezda et al. | 324/72.5 |
| 4,845,427 | 7/1989 | Hultin | 324/537 |
| 4,847,553 | 7/1989 | Seinecke | 324/158 P |
| 4,956,923 | 9/1990 | Pettingell et al. | 324/158 P |
| 4,973,903 | 11/1990 | Schemmel | 439/482 |
| 5,075,621 | 12/1991 | Hoyt | 324/158 P |
| 5,264,788 | 11/1993 | Smith et al. | 324/72.5 |

*Primary Examiner*—Vinh P. Nguyen
*Attorney, Agent, or Firm*—Francis A. Sirr; Earl C. Hancock

[57] ABSTRACT

Electrical connections to extremely small contact points or test connections are obtained by a tool which includes a stable base having a deformable flexible shaft extending therefrom. A needle type contact point in a spring biased mounting subassembly maintains contact electrically as the tip is forced against the test point by the shaft. The connector can include shielding against Radio Frequency Interference (RFI) or Electromagnetic Interference (EMI).

10 Claims, 2 Drawing Sheets

ELECTRICAL MEASURING AND TESTING PROBE HAVING A MALLEABLE SHAFT FACILITATING POSITIONING OF A CONTACT PIN

BACKGROUND OF THE INVENTION

1. Field of the Invention

This invention pertains to the field of electrical measuring and testing by the use of especially constructed probes or measuring electrodes. More particularly, the present invention relates to apparatus and methods of providing a temporary electrical interface between test equipment intended for obtaining static and/or dynamic information from electric signals and electrical test points as on printed circuit boards and integrated circuit chips.

2. Description of the Prior Art

Electrical connections for measurement, testing and signal acquisitions from early electronic components and circuits were frequently established by relatively blunt probes and/or spring biased jaws (sometimes called alligator clips) attached to wires. As the size of the electrical contacts diminished with miniaturization of circuits and integrated circuit chips developed, the clip connectors likewise diminished in size and needle point probes became popular. The advent of contemporary circuit chips necessarily has resulted in extremely small, high density electrical connections. It has become difficult, and sometimes impossible, to establish and maintain electrical contact on such connections by use of even miniaturized clips and needle probes.

The more recent art of electrical measuring and testing includes a number of devices for facilitating connection to test pads of printed circuits and the like. Thus, much of the prior art is predominantly directed to structure wherein probes are incorporated in automated test equipment rather than adapted for a tool suitable for manual use, such as by an electronics technician. Such devices have employed spring biased contactors to ensure continuous electrical contact despite variations in the closure force applied between the tool and the product under test.

For example, U.S. Pat. No. 4,151,465 by Lenz describes a test probe for use with microelectronic circuits wherein the test probe is provided with means for varying the pressure of a contact tip against the terminal pads of an electronic circuit under test. The probe of this device includes a flexible neck portion on whose end the contact tip is mounted. This flexible neck portion is provided with transverse slots into which flexible inserts are selectively inserted in order to control the tip pressure of the contact tip. The contact tip comprises a sleeve, a contact needle and a conductive lead.

U.S. Pat. No. 4,806,856 by Hvezda et al is also of general interest in that it describes an adjustable test probe assembly having a spring loaded metal probe tip whose horizontal and vertical positions are independently adjusted by means of a mechanically complex probe support device. Hvezda et al employ a relatively rigid mounting arm for holding the spring-biased probe over the contact point. The probe assembly sits within a plate or other test assembly base. The Hvezda et al device incorporates a relatively complex and expensive arrangement to allow physical positioning of test probes relative to the contact points.

Also of interest is U.S. Pat. No. 4,123,706 by Roch. As with Hvezda et al, this patent is concerned with cantilever mounting of a contact by dual spring arms that position a needle-like contact on an electrical contact point in a circuit element under test. All three of the above-mentioned patents are concerned with test probes for attachment in multiple probe configurations in a generally surrounding relationship to an opening in a fixed frame plate so as to contact substrate points on a table below the mounting plate. In all cases, the contact point is moved up and down by the relative motion between the table containing the substrate and the frame holding the contact tips.

U.S. Pat. Nos. 4,847,553 by Seinecke, 4,956,923 by Pettingell et al and 5,075,621 by Hoyt all show various arrangements of cantilever-mounted contact probes for engaging contact points on a substrate in various configurations and with various enhancements. U.S. Pat. No. 4,403,822 by Smith shows a needle point contact which is arranged so as to have isolation in a gas-type seal configuration relative to the environment of a test board.

Generally speaking, prior art devices as exemplified above that are constructed and arranged to facilitate connection to circuit board test pads are mechanically complex and expensive to construct. While these devices may prove generally suitable for their limited intended purposes, the need remains for an inexpensive test probe that is of simple and reliable construction with general utility in situations where use of customized test stations, alligator clips or hand-held probes are impractical, too expensive, or simply not available.

SUMMARY OF THE INVENTION

This invention pertains to electrical measuring and testing by the use of an especially constructed probe or measuring electrode. The probe of this invention has special utility in those situations where customized test stations are impractical or nonexistent.

The simple construction and arrangement of probes in accordance with the spirit and scope of the invention allow quick connection of test instruments, such as oscilloscopes, multimeters, etc., to electrical contacts on a wide variety of electrical devices. The invention is well suited for rapid adaptation to establish a test connection to surface mounted electrical components, for example components known as Plastic Leaded Chip Carriers (PLCC), Small Outline Integrated Circuits (SOIC), quad flatpacks, traces that pass from one layer of a printed circuit board to another (known as "VIAS") and components, such as printed circuit boards themselves which often have test hole points. It is possible by use of probes in accordance with the invention to contact test points having a variety of different constructions, accessibility and size including miniaturized edge contacts and the like.

No special tooling is required, and the probe is useable on any surface mount Printed Circuit Board (PCB) application. The difficulty of maintaining contact on a PCB by hand is avoided as is the need for soldering test leads to such a PCB. The invention is a remarkably handy tool for the technician, engineer or repairman working with PCB devices.

Preferred embodiments of probes in accordance with the invention generally comprise a weighted base, a flexible shaft extending from the base, a spring biased contact pin (possibly gold plated) supported by the free end of the flexible shaft, and a connection point adjacent to, and in electrical communication with, the contact pin for use in attaching a test instrument to the probe, thus making inexpensive, quick, easy and easily adaptable hands-off testing operations possible in the absence of complex and expensive special tooling.

The present invention is a probe for making test point connections to a printed circuit board or the like, which probe includes a base having a flexible arm extending therefrom for positioning a spring-biased, needle-like contact pin into electrical contact with the device under test. Connections to test equipment are possible through an electrical contact accessible in association with the top of the probe.

That is, this invention is a manually movable and positionable contact probe which includes a manually positionable means for engaging a surface and retaining a manually flexible elongated arm having a spring-biased needle probe on the exterior thereof which further is adapted to electrically connect the needle point to a test instrument contact pin. A manually positionable base secures one end of the elongated, flexible arm.

The manually-operable probe apparatus of this invention allows electrical interconnecting of test equipment with a test point on an electrical assembly. A weighted base member having a generally flat bottom surface is adapted for positioning in proximity to the electrical assembly. An elongated shaft of manually malleable material has a first end fixed to the base member, and a length suitable for allowing the second end of that shaft to extend over the electrical assembly. An electrical contact assembly attached to the shaft second end extends generally transverse thereto. This assembly includes a housing, an electrically conductive tip extending from that housing and a conductor retained by the housing for coupling to the electrical test equipment with the conductor in electrical communication with the tip. Thus, by placing the base on a supporting structure, such as a table, and manually forming the malleable shaft, it is possible to firmly and reliably engage the tip with the test point on the electrical assembly. This is followed by coupling of a lead from the electrical test equipment which results in reliable electrical communication between the test equipment and the test point.

Spring biasing of the tip within the housing can apply a force thereto in an outward direction from the housing. Employing a needle configuration for the tip permits contacting small electrical points on the electrical assembly, as is typically the case with printed circuit boards and integrated circuit chips. Use of a conductor formed with an elongated electrode on one end and a hollow chamber on the other end slidingly retains a tip biasing spring as well as the tip.

In one embodiment, the housing is an electrical insulating material molded in substantially surrounding relation to the electrical contact assembly with a bore therein for securely receiving the shaft second end. Further, by substantially encasing the electrical contact assembly, shielding is obtained for that assembly from interference by stray signals in the environment of the test point.

Those having normal skill in the art will recognize the foregoing and other objects, features, advantages and applications of the present invention from the following more detailed description of the preferred embodiments as illustrated in the accompanying drawings.

DETAILED DESCRIPTION OF THE INVENTION

This invention pertains to an electrical measuring and testing probe that is simple in construction and relatively foolproof in operation, such a probe having special utility in those situations where customized test stations are impractical, unavailable, or simply nonexistent. The invention has particular utility for those involved in the analysis, design and construction of prototype printed circuit boards, integrated circuit chips and the like, as well as for manufacturing, quality control and repair personnel who must work with similar such devices.

Figure 1:
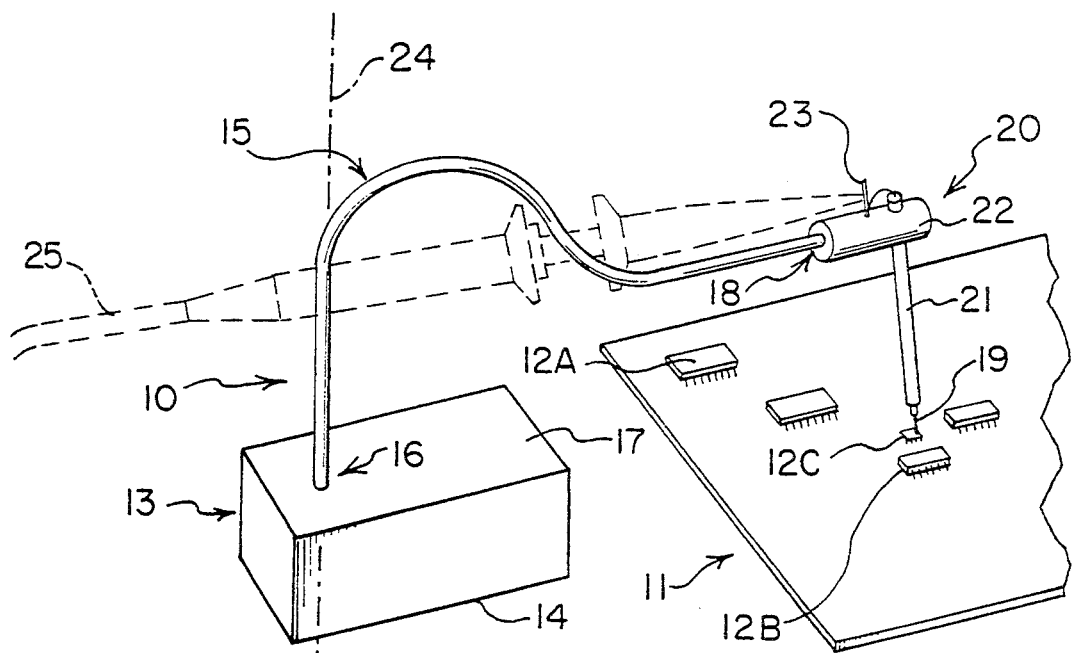
FIG. 1 is a perspective view of a test probe in accordance with the invention, showing the test probe associated with a circuit board having surface mounted components thereon.

FIG. 1 is a perspective view of one embodiment in accordance with this invention in the form of test probe 10. Probe 10 is shown associated with an electrical assembly in the form of a circuit board 11 that has a number of surface mounted components 12 thereon, including 12A, 12B and 12C. Each of components 12 typically is an integrated circuit chip with one or more extremely small electrical contact points, leads or test points associated therewith along with the interconnecting circuitry therefor on the board itself.

Manually-operable test probe 10 is constructed and arranged to make electrical connection with electrical test points associated with a generally planar electrical assembly which is usually horizontally supported, such as Printed Circuit Board (PCB) assembly 11. PCB 11 is shown in a partially broken view in FIG. 1 and, typically, incorporates a variety of electrical conductors interconnecting the various chips 12, as well as edge connectors or the like, for communication with other circuit elements. Board 11 and probe 10 are presented in FIG. 1 as they might appear relative to one another when placed upon a workbench or table (not shown) or the like. However, board 11 could easily remain within a host chassis as long as a reasonably stable support is provided for probe 10 with access to the desired circuit point or points on board 11.

A weighted base member 13 has a generally flat bottom surface 14 that is adapted for positioning generally adjacent to electrical assembly 11 (for example, on the above-mentioned table or workbench). A flexible shaft has a first end 16 fixed to base member 13 in extending relation from top surface 17 thereof. Shaft 15 extends from top surface 17 in a manner suitable for locating second end 18 on the outer end of shaft 15 to overhang electrical assembly board 11.

A contact head subassembly 20 is supported by the second end 18 of shaft 15, and includes housing 21 in generally vertically extending relation from collar 22. Housing 21 retains electrically conductive contact pin 19 such that downward flexing of shaft 15 manually is operable to bring contact pin 19 into electrical contact with a selected test point associated with electrical assembly 11. If shaft 15, housing 21 and/or collar 22 are constructed of conductive metal, it is preferable to coat them with an insulating plastic layer.

An electrical connection stub 23 is coupled in electrical communication with contact pin 19, while a conventional connector 25 operates via a spring biased, somewhat "C" or "L" shaped tip to facilitate the connection of an electrical test instrument (not shown), or the like, to the test point associated with electrical assembly 11. Preferably, contact pin 19 is configured with a needle tip for engaging the test point on board 11.

In using the FIG. 1 preferred embodiment, base 13 is placed in proximity to board 11. Flexible shaft 15 is fabricated of malleable material and, typically, is flexed manually until it occupies a generally horizontal plane. First end 16 is fixed to base member 13 so as to extend in a generally upward direction from top surface 17 of base member 13 to facilitate deforming of shaft 15 so as to clear intervening objects between base 13 and the point for which electrical contact of pin 19 is desired. Attachment of shaft 15 to the sides or ends of block 13 is acceptable, as is the inclusion of multiple holes in block 13 each capable of securely receiving a shaft 15.

Shaft 15 is deformable to allow the user to configure it to avoid any obstacles between base 13 and the device under test. It is possible to form shaft 15 in a generally circular arc that terminates in a horizontally-extending shaft portion terminating at the second end 18 of shaft 15, as shown in FIG. 1. In this manner, downward manual flexing of the second end 18 of shaft 15 is facilitated by manually changing the geometric configuration of shaft 15. Although some plastics may suffice for shaft 15, it is preferable that the material not have the plastic memory of many plastics since this would cause loss of the closure pressure at tip 19 and the board 11 contact point.

As is also apparent, the first end 16 of shaft 15 is supported by the top surface 17 of base member 13 in a manner to facilitate rotation of the horizontal plane of shaft 15 about a generally vertical axis 24.

Figure 2:
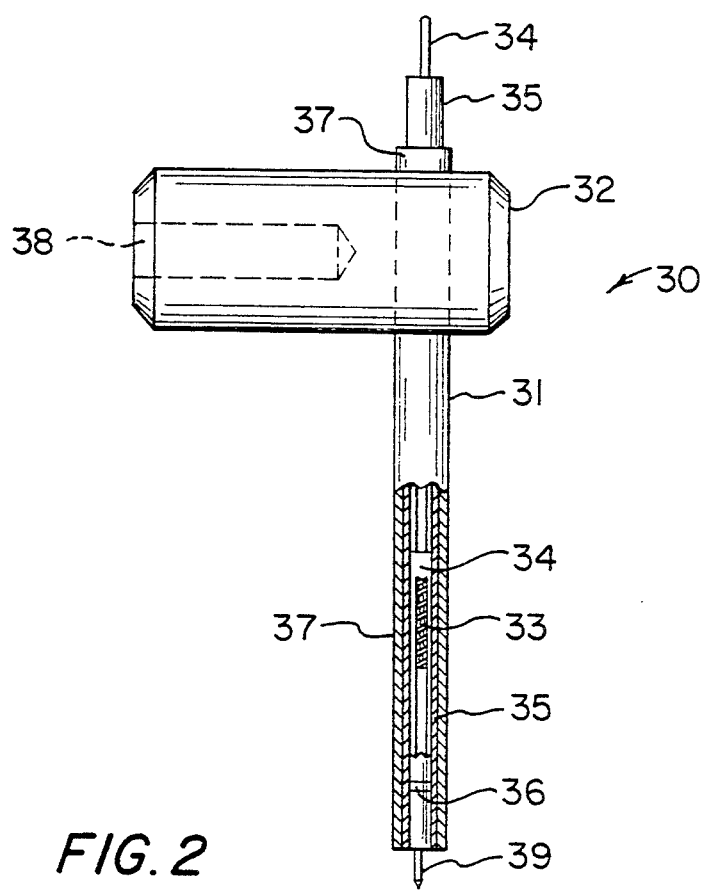
FIG. 2 is a sectioned view of a somewhat different contact tip portion suitable for use with the test probe of FIG. 1, showing the manner of spring biasing the contact tip, and the manner of mounting relative to the second end of the flexible shaft shown in FIG. 1.

A contact head 30 structure is shown in FIG. 2 which is similar to head 20 illustrated in FIG. 1, except it does not include a separate connector stub 23 on collar 32. Test contact head 30 includes spring biasing means 33 contained within the hollow chamber on the lower end of of electrical connector element 34 which is partially broken away to expose spring 33 in FIG. 2. The upper end of connector 34 extends from the top of head 30 as shown. An insulator sleeve 35 Surrounds connector 34, and retains it in place such as by a groove and tongue snap-in type device 36. An outer casing 37, functioning as an RF shield, surrounds most of the exterior of the spring biased pin subassembly.

Accordingly, attachment of a coaxial shielded cable to the upper extremity of connector 34 with its outer shield connected to sleeve 37 will minimize the effects of stray signals on the signal detected at the point under test. Note that, if desired, it is possible to attach a conventional coaxial or shielded cable connector to elements 34, 35 and 37. This would result in a simpler connection procedure, as well as providing even further isolation of the signal or voltage on conductor 34 from stray interference signals in the environment of the test point on the assembly under test.

Collar 32 has a bore 38 for securely receiving end 18 of shaft 15 as by a force fit. If desired, welding or otherwise bonding shaft 15 within bore 38 will suffice as will a set screw introduced transversely threaded into bore 38. Thus, the spring biasing is operable between the second end 18 of shaft 15 and contact pin 39 to maintain electrical contact force on pin 39 against the point under test after the shaft 15 is flexed into a configuration for creating downward pressure at tip 39, while spring 33 prevents loss of contact if arm happens to yield some of its downward force producing deformation.

While the invention is not limited by the dimensional characteristics of an actual implementation of the preferred embodiments thus far described, in such an embodiment base member 13 comprised a rectangular block fabricated of plated steel (although a wide variety of other materials are acceptable, such as steel or lead alloy, for instance), weighted around three quarters to one pound (or about 340 to 500 grams), and measuring about $2.5 \times 1.0 \times 1.0$ inches (or about $6 \times 2.5 \times 2.5$ cm). Shaft 15 comprised a wire formed, preferably of a lead alloy having about a one eighth inch diameter. Other materials with similar characteristics, such as lead free solder, are acceptable. The effective length of shaft 15, as measured in a horizontal direction from end 16 to end 18, was about 8.125 inches (or about 20.5 cm). Shaft 15 was covered by an insulation sheath comprising shrink tubing or other insulating plastic sleeve material. The vertical height of the probe head portion 20 or 30 from the lower surface of collar 22 or 32 including contact pin 19 was about 1.125 inches (or 3.0 cm).

Figure 3:
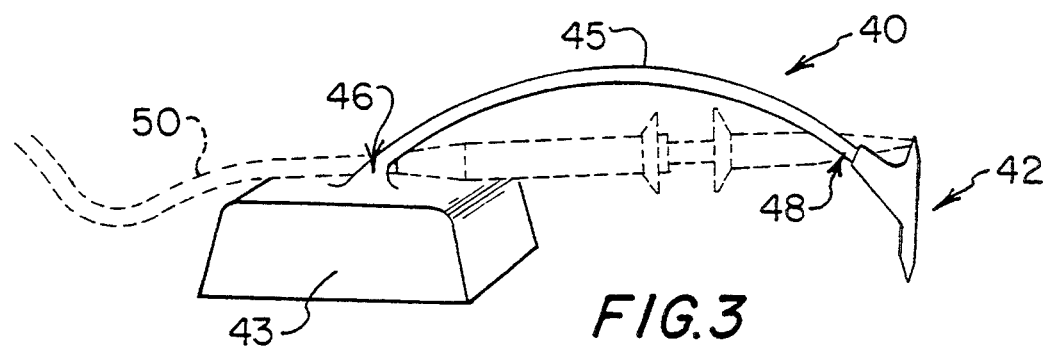
FIG. 3 is an isometric view of another embodiment of the present invention.

FIG. 3 is another embodiment of a probe 40 having a head subassembly 42 and a base member 43 which is configured with somewhat downwardly-flared sides to increase stability as it sits on a supporting surface (not shown). A conventional connector 50, coupled to a test device (not shown), is attached to the electrical output contact of head subassembly 42 via a spring clip somewhat similarly to that shown in FIG. 1.

Figure 4:
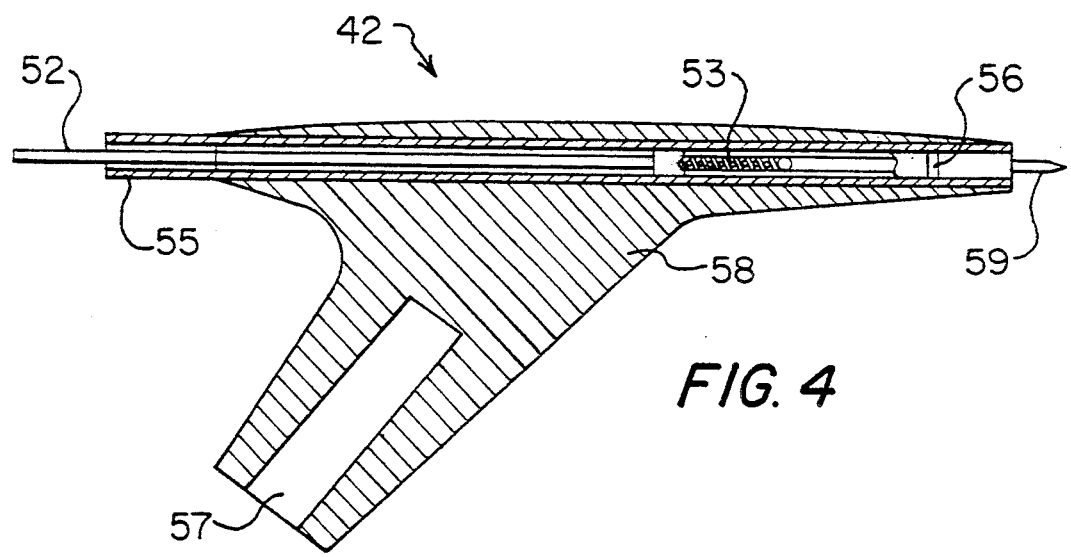
FIG. 4 is a sectioned view of the contact pin head for the embodiment shown in FIG. 3.

The head subassembly 42 is illustrated in rotated, and somewhat expanded version, in FIG. 4. Electrical connector 52 ends in a hollow chamber, shown in partially broken view in FIG. 4, for receiving spring 53. A sleeve 55 receives connector 52 by a snap-in ridge and groove arrangement 56. Needle point tip 59 is attached to spring 53 so as to move coaxially in and out without escaping from the interior of the chamber retaining spring, while continuously maintaining electrical contact with connector 52.

Housing 58 is formed of molded or machined insulating material (preferably of plastic). Connector 52 extends from the end opposite pin 59 for electrical contact by a lead to the appropriate test equipment. Bore 57 receives the end 48 of flexible arm or shaft 45, and retains it as by force fit, welding, bonding or a set screw. Note that it is possible to include a shielding sleeve surrounding an insulator layer the over the connector 52 and spring biased pin 59 structure if high frequency signal isolation of signals from the test pin 59 is desired. This structure would assume a internal configuration similar to FIG. 2.

Figure 5:
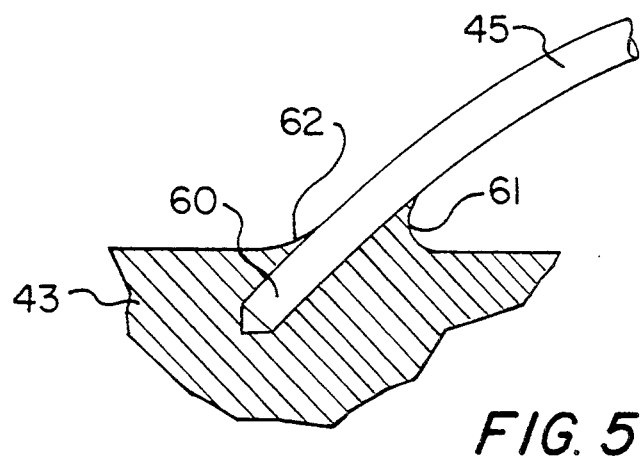
FIG. 5 is a sectioned view of the attachment of the elongated flexible arm of the FIG. 3 embodiment.

FIG. 5 shows the anchoring of flexible arm 45 to base block 43 via receiving bore 60. In the example shown, fillets 61 and 62 are formed into the base 43 structure to reinforce the support to arm 45 which extends from base 43 at an angle as shown.

While the exemplary preferred embodiments of the present invention are described herein with particularity, those having normal skill in the art will recognize various changes, modifications, additions and applications other than those specifically mentioned herein without departing from the spirit of this invention.

What is claimed is:

1. A manually operable test probe constructed and arranged to make electrical connection with electrical test points that are associated with a generally planar electrical assembly, the test probe comprising:

a weighted solid base metal member having a generally flat and horizontal bottom surface that is adapted for manual horizontal positioning generally adjacent to the electrical assembly, a solid and flexible wire shaft formed of a malleable material capable of manual bending and thereafter remaining in the bent position, said shaft having a first end fixed to said base member and extending generally horizontally therefrom in a manner to cause a second end of said shaft to vertically overhang the electrical assembly, an electrically conductive contact pin supported by said second end of said shaft, said contact pin being movable in a generally vertical direction and extending generally transverse to said shaft, such that downward manual flexing of said shaft is operable to bring said contact pin into electrical contact with a test point that is associated with the electrical assembly, and electrical connection means in electrical communication with said contact pin, said connection means facilitating the connection of an electrical test instrument or the like to the test point that is associated with the electrical assembly.

2. The test probe of claim 1 wherein said flexible shaft occupies a generally horizontal plane, said first end of said shaft being fixed to a top surface of said base member, said shaft extending upward from the top surface of said base member and forming an arc that terminates in a generally horizontally extending shaft portion, said generally horizontally extending shaft portion terminating at said second end of said shaft, whereby downward manual flexing of said shaft is facilitated by manually changing the geometric configuration of said arc.

3. The test probe of claim 2 including spring biasing means operable between said second end of said shaft and said contact pin and operable to spring bias said contact pin in a downward direction relative to said second end of said shaft.

4. The test probe of claim 3 wherein said first end of said shaft is supported by the top surface of said base member in a manner to facilitate rotation of said horizontal plane of said shaft about a generally vertical axis.

5. The test probe of claim 1 including means electrically insulating said contact pin from said second end of said shaft.

6. The test probe of claim 5 wherein said flexible shaft occupies a generally horizontal plane, said first end of said shaft being fixed to a top surface of said base member, said shaft extending in an upward direction from the top surface of said base member and forming an arc that terminates in a generally horizontally extending shaft portion, said generally horizontally extending shaft portion terminating at said second end of said shaft, whereby downward manual flexing of said shaft is facilitated by manually changing the geometric configuration of said arc.

7. The test probe of claim 6 including spring biasing means operable between said second end of said shaft and said contact pin and operable to spring bias said contact pin in a downward direction relative to said second end of said shaft.

8. The test probe of claim 7 wherein said first end of said shaft is supported by the top surface of said base member in a manner to facilitate rotation of said horizontal plane of said shaft about a generally vertical axis.

9. The test probe of claim 1 which includes means shielding substantially all of said electrically conductive contact pin and said electrical connection means from interfering signals in the environment of the test point of said electrical assembly.

10. The test probe of claim 1 wherein said electrical connection means includes an elongated electrode having the ends thereof arranged for electrical connection with said contact pin and an electrical signal receiving device, respectively.

* * * * *